United States Patent

Lubarsky, Jr.

[15] 3,701,953

[45] Oct. 31, 1972

[54] DIGITAL PHASE LOCK LOOP CIRCUIT EMPLOYING OSCILLATOR TRIGGERED AT ZERO VOLTAGE CROSSING OF INPUT SIGNAL

[72] Inventor: Andre Lubarsky, Jr., Sunnyvale, Calif.

[73] Assignee: Telecommunications Technology, Inc.

[22] Filed: Nov. 16, 1970

[21] Appl. No.: 90,103

[52] U.S. Cl. ....................328/155, 328/150

[51] Int. Cl. ....................H03b 3/04, H03k 5/18

[58] Field of Search ....................328/155, 150

[56] References Cited

UNITED STATES PATENTS

| | | | |
|---|---|---|---|
| 3,337,814 | 8/1967 | Brase et al. | 328/155 X |
| 3,529,250 | 9/1970 | Farrow et al. | 328/155 |
| 3,544,717 | 12/1970 | Smith | 328/155 X |
| 3,557,308 | 1/1971 | Sanford | 328/155 X |

*Primary Examiner*—John S. Heyman
*Attorney*—Limbach, Limbach & Sutton

[57] ABSTRACT

A predetermined number of pulses from the output of a controlled oscillator means is counted. The time duration required to reach this number is compared to the time duration of a predetermined portion of an input signal. On the basis of this comparison the pulse frequency of the oscillator means is varied such that in subsequent time duration comparisons, the time difference is substantially eliminated and the output pulses are in a phase relationship with said input signal.

12 Claims, 8 Drawing Figures

INVENTOR.
ANDRE LUBARSKY, JR.
BY
Limbach, Limbach and Sutton
ATTORNEYS

INVENTOR.
ANDRE LUBARSKY JR.

BY Limbach, Limbach and Sutton

ATTORNEYS

INVENTOR.
ANDRE LUBARSKY, JR.
BY
Limbach, Limbach and Sutton
ATTORNEYS

INVENTOR
ANDRE LUBARSKY, JR.
BY Limbach, Limbach and Sutton
ATTORNEYS

DIGITAL PHASE LOCK LOOP CIRCUIT EMPLOYING OSCILLATOR TRIGGERED AT ZERO VOLTAGE CROSSING OF INPUT SIGNAL

BACKGROUND OF THE INVENTION

The present invention relates to phase lock loop circuits, and more particularly to an improved digital phase lock loop circuit.

Phase lock loop circuits have many applications such as in multipliers, fast counters, and phase jitter testing equipment. Recently developed digital phase lock loop circuits have been an improvement over analog phase lock loop circuits used in the past. However, these, also, have several significant disadvantages.

Digital phase lock circuits presently available have comparatively low lock or capture ranges. That is, the range of input or reference frequencies over which these circuits are operable is small. Typically prior art phase lock loop circuits are restricted to a very limited range of input frequencies, at most in the two-to-one-range. Outside of this input frequency range, no phase-locked output is possible.

It is therefore an object of the invention to provide an improved digital phase lock loop circuit.

Another object of the invention is to provide an improved digital phase lock loop circuit capable of providing a digital phase-locked output signal over a wide range of input frequencies.

A further object of the invention is to provide a digital phase lock loop circuit which is operable to provide a multiplied phase locked output having a frequency N-times that of the input signal frequency, where N is an integer.

Another object of the invention is to provide an improved digital phase lock loop circuit having a large capture range and which is useful in a large number of applications.

SUMMARY OF THE INVENTION

In accordance with the broadest aspects of the present invention, a predetermined number of pulses from the output of a controlled oscillator means, such as a voltage controlled oscillator, are counted and the time duration required to count these pulses is compared with the time duration of a predetermined portion of the input signal. Typically the predetermined portion of the input signal is one cycle.

Based upon, and responsive to the difference in these time durations, means are provided for providing correction signals to the oscillator means to change the output pulse frequency therefrom, such that in subsequent time duration comparisons the time difference is reduced and quickly eliminated. When this time difference is eliminated then the output signal from the oscillator means is phase locked with the input reference signal, and in one embodiment the output frequency is multiplied to N-times the frequency of incoming signal.

The correction signal either increases or decreases the output frequency of the oscillator means depending upon whether the oscillator frequency is greater or less than the input signal frequency. Hence, if the oscillator frequency is less than that of the input signal frequency, and therefore the time duration of the predetermined number of pulses is greater than that of the predetermined portion of the input signal, the output frequency of the oscillator is reduced.

If this reduction is not enough to bring the oscillator output frequency up to that of the input signal, subsequent time duration comparisons eventually result to eliminate the difference.

If the oscillator frequency is greater than the input signal, or if too great a reduction of frequency takes place in the example of the preceding paragraph, the time duration to count the predetermined number of pulses is less than that of the predetermined portion of the input signal. In this situation the correction signal drives the oscillator to a higher frequency, until the time difference is eliminated.

Hence, the correction signals control the oscillator in two ways; first by increasing or decreasing the oscillator output frequency depending upon whether the oscillator frequency is less or greater than that of the input signal, and secondly, by controlling the magnitude of the frequency change, depending how "far off" the oscillator frequency is.

In accordance with another aspect of the invention, the circuitry of the present phase lock loop is easily modified to provide an output signal which is phased locked to the input signal, and which has a frequency N-times that of the input signal frequency, where N is an integer. This is accomplished by using an N-digital counter, with the number of digits corresponding to the frequency multiplication factor.

DESCRIPTION OF THE PREFERRED EMBODIMENT(S)

Figure 1:
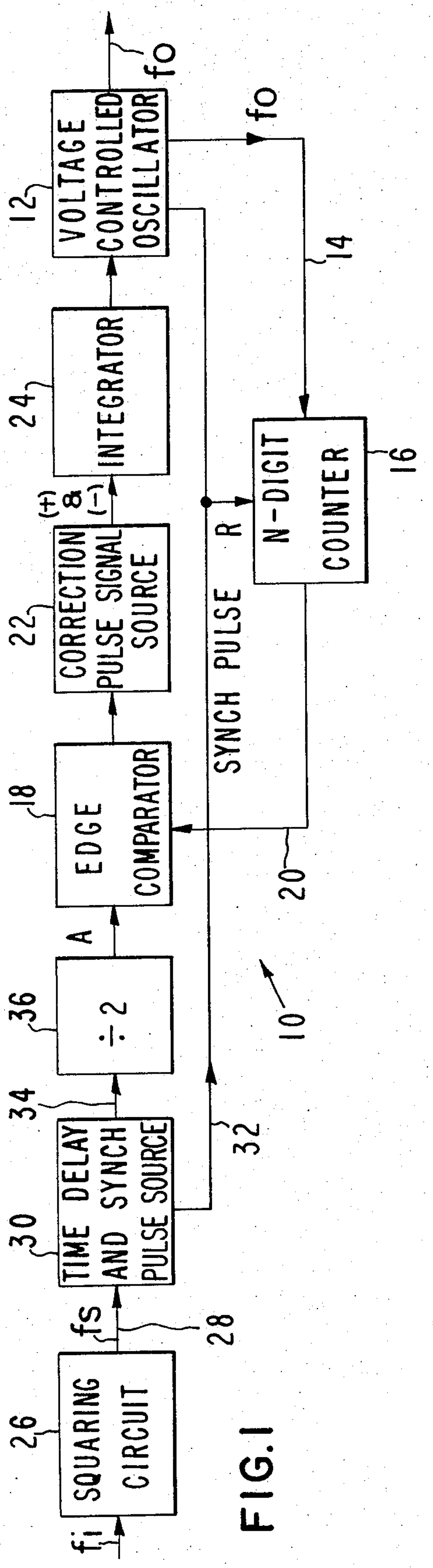
FIG. 1 is a block schematic diagram of the improved digital phase lock loop circuit of the present invention.

FIG. 1 illustrates an improved digital phase lock loop circuit 10 in accordance with the present invention. The output fo, from a voltage controlled oscillator 12 is phase locked to the a.c. input signal, fi. The output from oscillator 12 is also sent through a line 14 to an N-digit counter 16. As will be seen later N can be any integer.

In accordance with the invention, the time duration required for the N-digit counter 16 to count N pulses from the oscillator 12 is compared with a predetermined portion of the input signal fi. This comparison is made by an edge comparator circuit 18 which is connected with the counter 16 by line 20.

Depending upon which has the longest duration, i.e., the time for counter 16 to count to N or the length of time of the predetermined portion of the input signal, *fi*, a correction pulse signal source circuit 22 supplies a (+) or (−) correction signal to an integrator 24, which in turn causes the output frequency of voltage controlled oscillator 12 to increase and decrease respectively.

Figure 5:
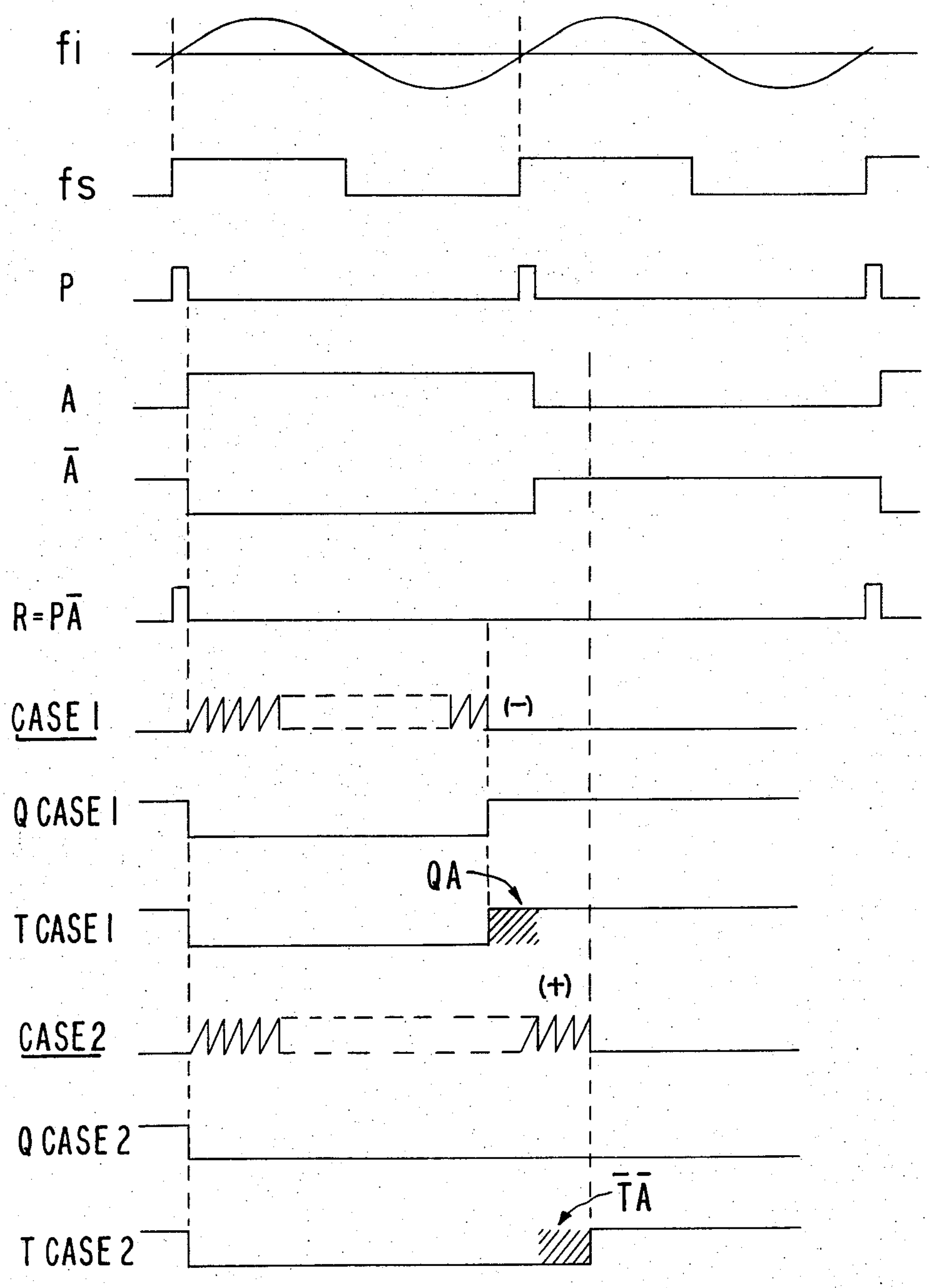
FIG. 5 illustrates graphically various waveforms in the circuit of FIG. 4.

The input signal *fi* first goes through a squaring circuit 26. The resulting waveform *fs* is shown in FIG. 5, as well as other waveforms to be described. The *fs* signal is then sent over line 28 and delayed for a predetermined time at 30. During this delay, a synch pulse R, having a width corresponding to the time delay of 28, is sent via line 32 to reset the counter 16 to zero and to reset the voltage controlled oscillator 12. This insures that the leading edge of the first subsequent output pulse *fo* from oscillator 12 is in phase with the input signal *fi*.

The time-delayed squarewave signal *fs* then passes through line 34 to a divide-by-two circuit 36, the output of which is designated as A. In the illustrated embodiment, the predetermined portion of the input signal *fi* which is used in the comparison with time required for the counter 16 to count to N, is one cycle. As can be seen in FIGS. 1 and 5, the actual comparison of these two time periods, which is made by edge comparator 18, is made with the first 180° of signal A.

In operation, if the frequency of the output signal of oscillator 12 is too high, i.e., where N *fi* freq. > *fo* freq., counter 16 counts to N before signal A reaches 180° (drops to its low level). This is the (−) situation, and as explained above, a (−) correction signal causes the oscillator 12 to reduce the frequency of *fo*.

If the amount of the resulting frequency change is correct, then at the time of the next time comparison (one *fs* cycle later;½ A cycle later), the time difference between A and the time for counter 16 to reach N is zero. When this occurs the output frequency *fo* is in phase with the input signal *fi*. Further, the output pulse signals *fo* will be at a frequency N times that of the input signal *fi*.

If the frequency *fo* of the voltage controlled oscillator is too low or if a reduction in the frequency of the voltage controlled oscillator 12 occurs because of an over-correction to the situation of case 1, i.e., where N *fi* freq. < *fo* freq., the situation of case 2 occurs. Here it takes the counter 16 more time than the 180° period of signal A to count to N. This results in the (+) correction situation. Here the correction pulse signal source 22 provides a (+) signal to the integrator 24 which acts to increase the frequency of the voltage controlled oscillator 12.

Generally, it only takes a few cycles of *fs* before the voltage controlled oscillator 12 is at exactly the right frequency so that the N-digit counter 16 counts up to N exactly in the first half period of A.

As explained above the phase lock circuit 10 of the present invention can be operated as a frequency multiplier or to provide a digital phased locked output with a pulse frequency rate of fo corresponding exactly to that of the frequency of the input signal *fi*.

Figures 2A, 2B:
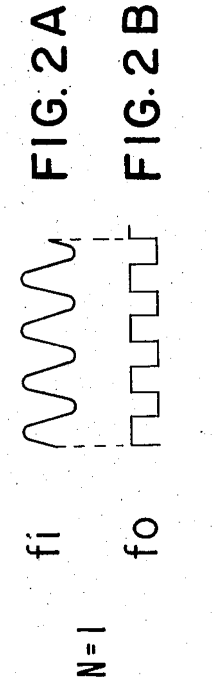
FIGS. 2A and 2B illustrate waveforms for a phase lock circuit without multiplication.

This latter mode is illustrated in FIGS. 2A and 2B. This situation occurs where N = 1. Note that the output pulses *fo* are in phase with the input signal *fi*. An *fo* pulse is provided at the beginning of each cycle of *fi*. As a practical matter where there is a one-to-one correspondence between the input and output signals as in this case, the voltage controlled oscillator 12 is desirably replaced by a variable width pulse generator, such as a one-shot multivibrator.

Figures 3A, 3B:
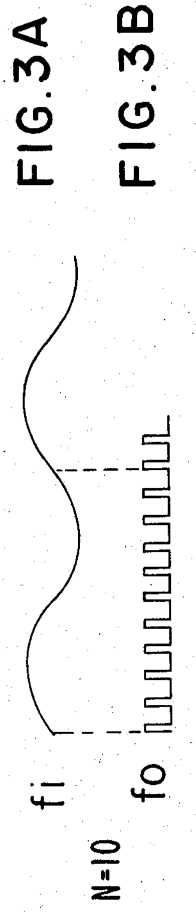
FIGS. 3A and 3B illustrate waveforms for a phase lock circuit with multiplication.

The multiplier mode is illustrated in FIGS. 3A and 3B, with N, the count level of counter 12, equal to 10 given for purposes of illustration. It can be seen that the output pulse signal, *fo*, is provided at a pulse frequency 10 times that of the frequency of the input signal *fi*. Note that the leading edge of the first, eleventh, twenty-first, etc. pulses are exactly in phase with the beginning of each cycle of *fi*, and that there is 10 *fo* pulses for each *fi* cycle.

The input signal *fi* can be digitally multiplied by any number merely by changing the maximum count level of the N-digit counter 16 to a number N corresponding to the desired multiplication factor. For example if multiplication by 5 is desired, counter 16 is set to count to 5; if multiplication by 30 is desired, N is set at 30, etc.

The important difference in operation of the phase lock loop circuit of the present invention over operation of prior art circuits is that there is no 2:1 or any other input frequency capture range restriction. The capture range of the circuit of the present invention is limited only by the frequency range of the voltage controlled oscillator 12. Further, the improved phase lock loop circuit of the present invention can provide a multiplied output, *fo*, over the entire range of input frequencies.

Figure 4A:
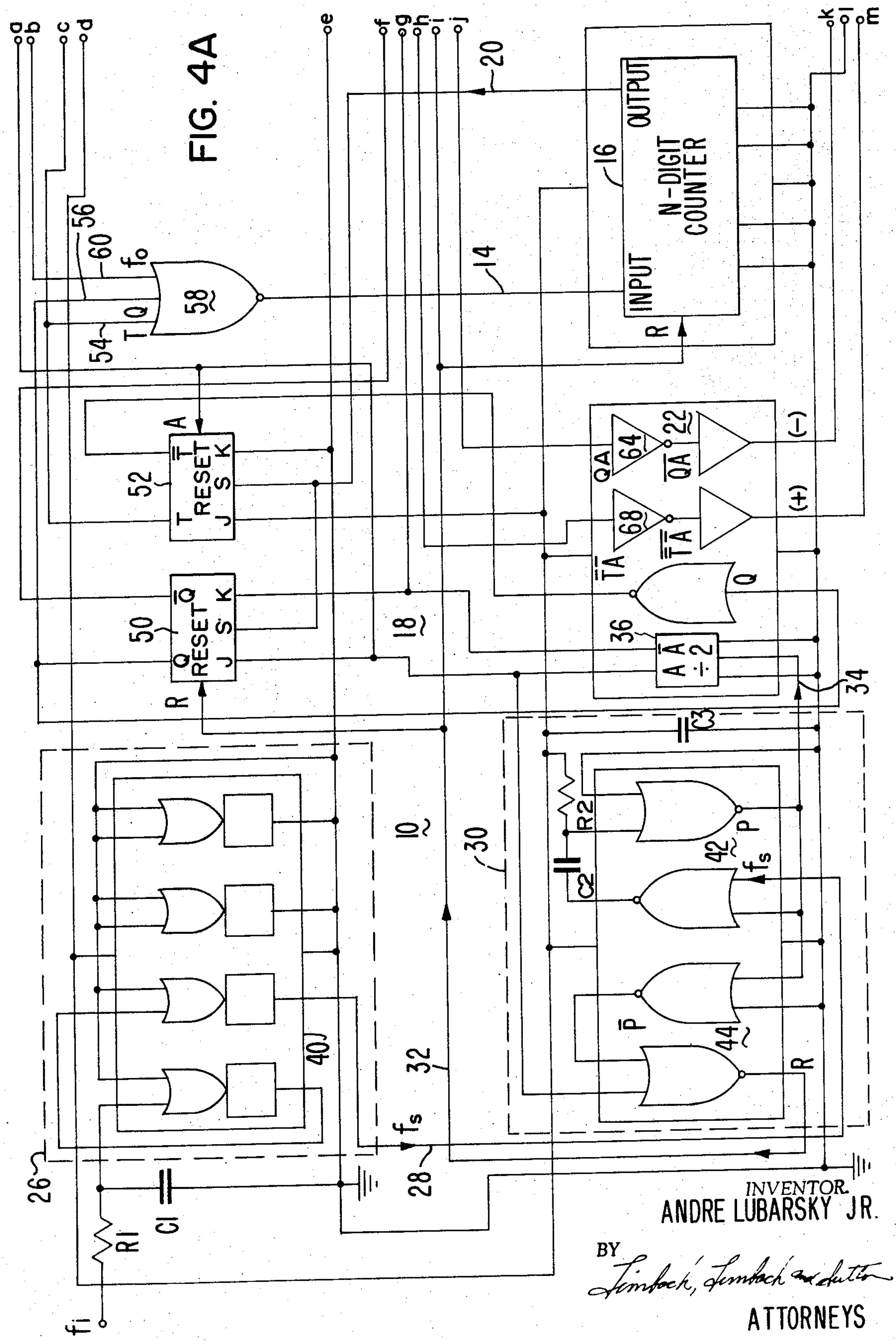
FIGS. 4A and 4B are more detailed schematic diagrams of one embodiment of the circuit of FIG. 1.
Figure 4B:
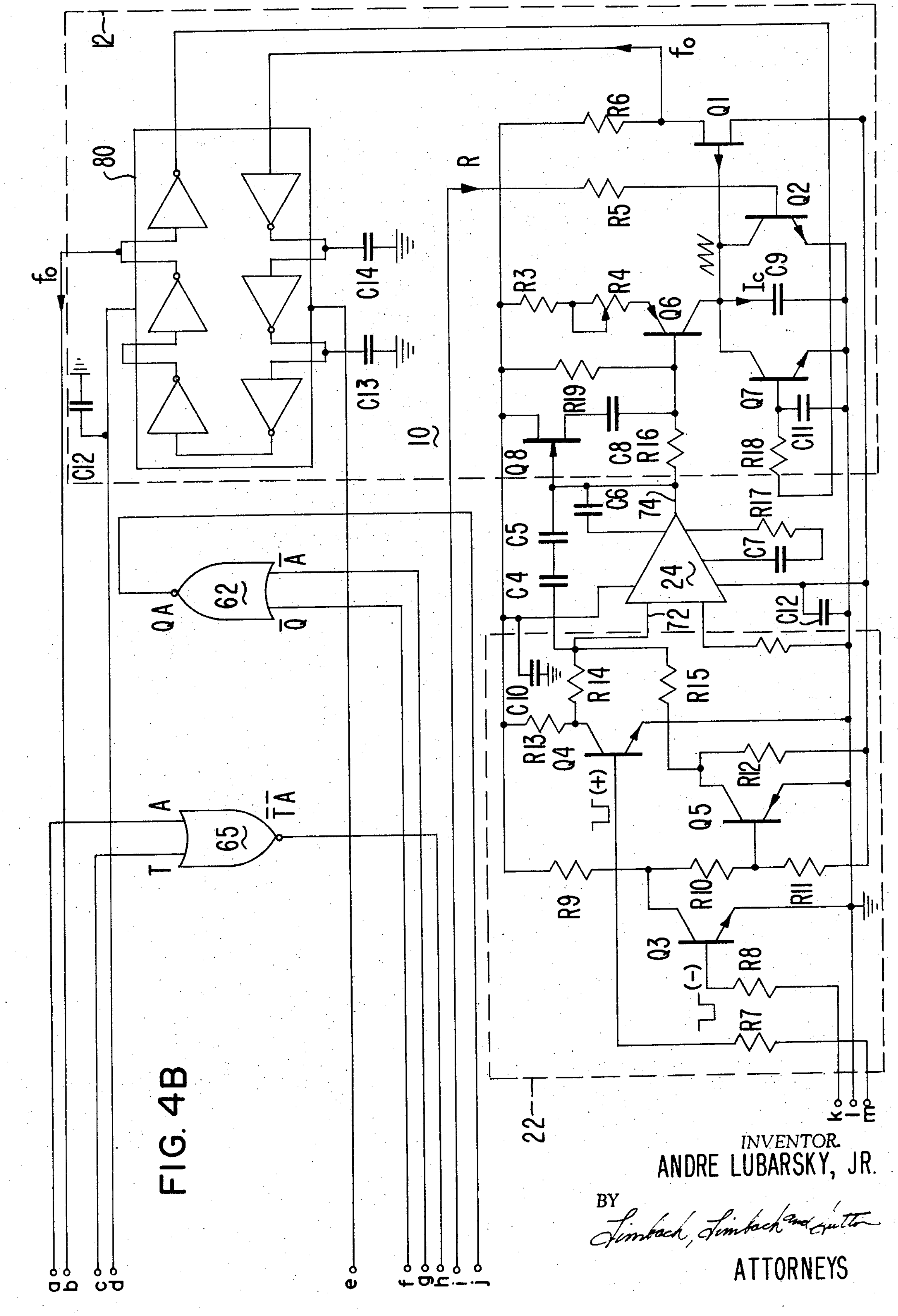

An operative embodiment of the phase lock loop circuit 10 of FIG. 1 is illustrated schematically in FIGS. 4A and 4B. Reference is additionally made to FIG. 5 illustrating signals and waveforms described below.

The squaring circuit 26 comprises a Schmidt trigger circuit 40. The time delay and synch pulse source 30 comprises a first one-shot multivibrator 42 which serves as the time delay. The output P (see FIG. 5) from the multivibrator 42 drives the divide-by-two circuit 36, which comprises a standard flip-flop circuit, giving the output signal A. A second multivibrator 44 is coupled to multivibrator 42 and is used to eliminate the P pulse every other cycle. The resulting signal therefrom is the synch signal R used to reset the counter 16 and synch the oscillator 12.

The edge comparator circuit 18 includes first and second flip-flops 50 and 52, having Q and $\bar{Q}$, and T and $\bar{T}$ outputs as shown. When a reset pulse R is sent, flip-flop 50 output Q goes to zero because of the presence of signal $\bar{A}$ at its input J. $\bar{A}$ is used herein to describe the situation of "not A," as illustrated in FIG. 5. Simultaneously, the out T of flip-flop 52 is reset by the leading edge of signal A. With T and Q both at ZERO the inputs 54 and 56 of NOR-gate 58 are at ZERO and fo pulses from the oscillator 12 pass through the input 60 of gate 58 and hence through the line 14 to the input of the N-digit counter 16.

Referring to the waveforms of FIG. 5, in the situation illustrated in case 1, the frequency of oscillator 12 is too high and hence the time duration of signal A, i.e., *fi*/2, exceeds the time required for counter 16 to count N pulses. When the counter 16 counts to N a counter output signal is sent via line 20 to the strobe or timing terminals S of each of the flip-flops 50 and 52, causing T and Q both to go to a ONE binary state. With Q a ONE and with A also a ONE (since the time duration of A exceeds the counter time) $\bar{Q}$ and $\bar{A}$ are both ZERO. NOR-gate 62 is responsive to that combination to provide a ONE or QA output.

The QA output is then inverted by inverter 64 to provide a $\overline{QA}$, a ZERO, binary signal. This ZERO binary signal is designated as the plus signal, (−), in FIG. 4A. As will be explained subsequently the presence of a low or binary ZERO (−) signal causes the oscillator 12 to increase the frequency of its output signal *fo*.

In summary then where case 1 exists, a (−) correction signal is provided whenever the following condition is met, as expressed on Boolean form:

(−) = $\overline{QA}$, where a (−) signal must be low, i.e., a binary ZERO to decrease the output frequency of oscillator 12.

Note that when T and Q go to the binary ONE state, the NOR-gate 58 no longer permits oscillator signals to counter 16. Thus the counter does not continue to count.

In the situation of case 2, the frequency of fo is too low and hence signal A goes to its low or to the $\overline{A}$ state prior to the time that counter 16 counts to N. In this situation it is therefore necessary to increase the frequency of *fo*.

Simultaneously Q and T also are in the ZERO state after being reset by R and A signals respectively. When counter 16 counts to N, T goes to ONE. During the period that A and T are ZERO, NOR-gate 64 provides a ONE output signal, designated $\overline{TA}$. When this signal is inverted at 68, the resulting ZERO signal $\overline{\overline{TA}}$ activates the oscillator 12 in a manner, as will be described, to increase the frequency of the output signals, *fo*.

Note that in the situation of case 2, during the period designated (+) in FIG. 5, both T and Q are in the low or ZERO state. This allows NOR-gate 58 to pass the oscillator 12 signals fo to the counter 16 until the court is complete.

To summarize, where case 2 exists, a (+) correction signal is provided whenever the following condition is met, as expressed in Boolean form:

(+) = $\overline{\overline{TA}}$, where a (+) signal must be low, i.e., ZERO binary state to increase the output frequency of oscillator 12.

The voltage controlled oscillator 12 includes a capacitor C9 coupled through transistor Q6 with the output of the integrator 24. At the beginning of a time comparison the synch pulse R turns on transistor Q2 thereby shorting out C9 to insure that the first fo pulse is synchronized with the input signal *fi*.

Transistor Q6 acts as a current source to charge capacitor C9 with current Ic. Capacitor C9 is discharged when capacitor C11 charges to a sufficiently high voltage to turn on transistor Q7, and thereby providing a discharge path for capacitor C9.

It can be seen that the greater the current Ic, the faster C9 charges. Hence, when the current Ic increases the frequency of *fo* also increases, and vice versa. Since Q6 is an PNP-transistor a decrease in its base voltage causes an increase in Ic and an increase in base voltage causes a decrease in Ic.

A (−) correction signal reduces the base voltage of Q3 and causes Q3 to turn off. This increases the current flow through R10 and R11, which in turn raises the base voltage of Q5, turning it off. This has the effect of decreasing the voltage at the input 72 of integrator 24, which in turn increases the output voltage 74 of integrator and decreases the current Ic to capacitor C9 to thereby decrease the frequency of *fo*.

A (+) correction signal reduces the base voltage of transistor Q4, turning it off. This causes a surge of current through R14 which lowers the voltage at the input 72 of integrator 24, raises the voltage of the output thereof, lowers the base voltage of Q6, increases Ic, all to thereby increase the frequency of *fo*.

The ramp voltage created across capacitor C9 is then sent through a high input impedance buffer stage comprising an FET transistor Q9. From there the fo signal is used to drive a saturation amplifier 80, which converts fo from a ramp or sawtooth signal into pulse signals.

The integrator 24 provides two functions. First it holds the corrected signal information until the next time comparison, i.e., during $\overline{A}$. Secondly it smooths the pulse signals from the correction pulse signal source 22 to provide d.c. signals to the voltage-controlled oscillator 12.

While the embodiment of FIGS. 4A and 4B have been described in sufficient detail to enable one skilled in the art to make the same, the following circuit component values for one actual embodiment are additionally provided as follows:

| | |
|---|---|
| R1 | 1 K-ohm |
| R2,R3,R17 | 1.5 K-ohm |
| R4 | 5 K-ohm |
| R5,R7,R8,R18 | 470 ohms |
| R6 | 2.2 K-ohms |
| R9 | 6.8 K-ohms |
| R10 | 1 K-ohm |
| R11 | 10 K-ohms |
| R12,R13,R16,R19, | 6 K-ohm |
| R14,R15 | 100 K-ohms |
| C1 | 10 picofarads |
| C2, C13,C14 | 470 picofarads |
| C3,C12 | .1 microfarads |
| C4,C5 | 2 microfarads |
| C6,C8 | 200 picofarads |
| C7 | 5000 picofarads |
| C9 | 1000 picofarads |
| C10 | .05 microfarads |
| C11 | 5000 picofarads |
| Q1 | 2N5462 |
| Q2,Q3,Q4,Q7, | 2N5134 |
| Q5 | 2N5139 |
| Q6 | 2N5138 |
| Q8 | 2N5459 |
| Schmidt trigger circuit 40 | MC9809 P |
| Multivibrators 42 & 44 | MC824 P |
| Integrator 24 | UL709 |
| Saturation amplifier 80 | MC889 P |

I claim:

1. Digital phase lock loop circuit comprising:
a. controlled oscillator means for providing variable frequency output pulse signals;
b. means for counting a predetermined number of said output pulse signals;
c. means for comparing the time duration of a predetermined portion of an incoming input signal with the time duration required to count said predetermined number of output pulses;
d. said time duration comparison means including means for synchronously resetting said counter means and triggering said oscillator means to coincide with a zero voltage crossing of said predetermined portion of said input signal; and
e. means responsive to said time duration comparison for providing correction signals to said oscillator means, said oscillator means being responsive thereto to provide an output signal at a frequency such that in subsequent time duration comparisons said time difference is substantially eliminated and said input and said output signals are in the same phase relationship at least at the beginning and end of said time comparison sequence.

2. Digital phase lock loop circuit as in claim 1 wherein said time duration comparison means includes means for converting said incoming input signal into a squarewave signal of the same frequency.

3. Digital phase lock loop circuit as in claim 2 wherein said predetermined portion of said input signal comprises one cycle thereof.

4. Digital phase lock loop circuit as in claim 3 wherein said time comparison means additionally includes means for dividing the frequency of the squarewave signal by two, whereby said time comparison is thereby made with one-half cycle of said divided square wave signal.

5. Digital phase lock loop circuit as in claim 1 wherein said counting means comprises an N-digit counter circuit.

6. Digital phase lock loop circuit as in claim 5 wherein N=1 and wherein said oscillator means comprises a variable pulse width generator.

7. Digital phase lock loop circuit as in claim 5 wherein N is an integer greater than 1, and wherein the output pulse rate, frequency is equal to N times the frequency of the input signal.

8. Digital multiplier circuit for providing N output pulses for each cycle of an input signal, where N is an integer and wherein the first output pulse for each N pulses begins coincidentally with the beginning of each cycle of the input signal, wherein the invention comprises:

a. frequency controllable pulse generator means for providing output pulse signals;

b. means for counting said output pulses, said counter means being responsive thereto to count up to N pulses;

c. means for comparing the time duration of a predetermined portion of an input signal with the time duration required for said counter means to count N pulses;

d. said time duration comparison means including means for synchronously resetting said counter means and triggering said oscillator means to coincide with a zero voltage crossing of said predetermined portion of said input signal; and e. means responsive to said time duration comparison for providing pulse rate correction signals to said pulse generator means, said pulse generator means being responsive thereto to provide output pulses as a frequency such that in subsequent time duration comparisons said time difference is substantially eliminated and the frequency of the output pulses is N times the frequency of the input signal.

9. Digital phase lock loop circuit as in claim 8 wherein said time duration comparison means includes means for converting said incoming input signal into a squarewave signal of the same frequency.

10. Digital phase lock loop circuit as in claim 9 wherein said predetermined portion of said input signal comprises one cycle thereof.

11. Digital phase lock loop circuit as in claim 10 wherein said time comparison means additionally includes means for dividing the frequency of the square wave signal by two, whereby said time comparison is thereby made with one-half cycle of said divided square wave signal.

12. A method of providing a digital phase-locked output signal in response to an input signal, comprising:

generating an output pulse train beginning at a time corresponding to a zero voltage crossing of the input signal, the frequency of the pulse train being variable, counting a predetermined number of output pulses, said count beginning at a time corresponding to the same zero voltage crossing of the input signal as the generation of the output pulse train;

comparing the time duration of a predetermined portion of the input signal with the time duration required to count said predetermined number of output pulses; and correcting the frequency of the output pulse train in response to the time duration comparison such that during subsequent time duration comparison steps said time difference is eliminated.

* * * * *